(12) United States Patent
Mack et al.

(10) Patent No.: US 11,333,529 B2
(45) Date of Patent: May 17, 2022

(54) MAGNETIC POSITION SENSOR

(71) Applicant: Swoboda Schorndorf KG, Schorndorf (DE)

(72) Inventors: Bernd Mack, Remshalden (DE); Sorin Petrusan, Schorndorf (DE)

(73) Assignee: SWOBODA SCHORNDORF KG

( * ) Notice: Subject to any disclaimer, the term of this patent is extended or adjusted under 35 U.S.C. 154(b) by 240 days.

(21) Appl. No.: 16/418,441

(22) Filed: May 21, 2019

(65) Prior Publication Data

US 2019/0360840 A1 Nov. 28, 2019

(30) Foreign Application Priority Data

May 22, 2018 (DE) .......................... 102018207994.3

(51) Int. Cl.
*G01D 5/20* (2006.01)
*H05K 1/16* (2006.01)
*H01F 27/28* (2006.01)

(52) U.S. Cl.
CPC ....... *G01D 5/2046* (2013.01); *H01F 27/2804* (2013.01); *H05K 1/165* (2013.01); *H05K 2201/10151* (2013.01)

(58) Field of Classification Search
None
See application file for complete search history.

(56) References Cited

U.S. PATENT DOCUMENTS

| 4,774,465 A | 9/1988 | Nilius |
| 6,605,939 B1 * | 8/2003 | Jansseune ............ G01D 5/2033 324/207.16 |
| 10,060,764 B2 | 8/2018 | Lehmann et al. |
| (Continued) |

FOREIGN PATENT DOCUMENTS

| DE | 3610479 A1 | 10/1987 |
| DE | 4311973 A1 | 2/1997 |
| (Continued) |

OTHER PUBLICATIONS

English abstract for EP2149784.
(Continued)

*Primary Examiner* — Jermele M Hollington
*Assistant Examiner* — Suresh K Rajaputra
(74) *Attorney, Agent, or Firm* — Fishman Stewart PLLC

(57) ABSTRACT

A magnetic position sensor may include a coil arrangement, a magnetic coupling element, and a test element movable along a measurement path. The coil arrangement may include at least one transmitter coil and at least one receiver coil. The at least one transmitter coil may provide an alternating magnetic field. A magnetic flux provided via the at least one transmitter coil may at least partly pass through the at least one receiver coil. The magnetic coupling element may be configured to at least one of amplify the magnetic flux and at least partly guide the magnetic flux to the at least one receiver coil. The test element may provide a magnetic field large enough to locally magnetically saturate the magnetic coupling element. The magnetic coupling element may include at least one of a high-resistance material that is magnetizable, and a magnetizable material and a material with a specific electrical resistance.

20 Claims, 2 Drawing Sheets

(56) References Cited

U.S. PATENT DOCUMENTS

| | | | | |
|---|---|---|---|---|
| 2007/0194781 | A1* | 8/2007 | Zhitomirskiy | ......... G01D 5/204 |
| | | | | 324/207.17 |
| 2017/0234703 | A1 | 8/2017 | Acker | |
| 2018/0218823 | A1* | 8/2018 | Kothandaraman | ... H01F 41/041 |

FOREIGN PATENT DOCUMENTS

| | | |
|---|---|---|
| DE | 102014219009 A1 | 3/2016 |
| DE | 102014219092 A1 | 3/2016 |
| EP | 0707190 A2 | 4/1996 |
| EP | 2149784 A1 | 2/2010 |

OTHER PUBLICATIONS

English abstract for EP0707190.
Extended European Search Report dated Sep. 13, 2019 related to corresponding European Patent Application No. EP19175177.
English abstract for DE4311973.
"Metallisches Glas", Wikipedia, Jan. 3, 2019.
"Weichmagnetische Werkstoffe", Wikipedia, Jan. 4, 2019.

* cited by examiner

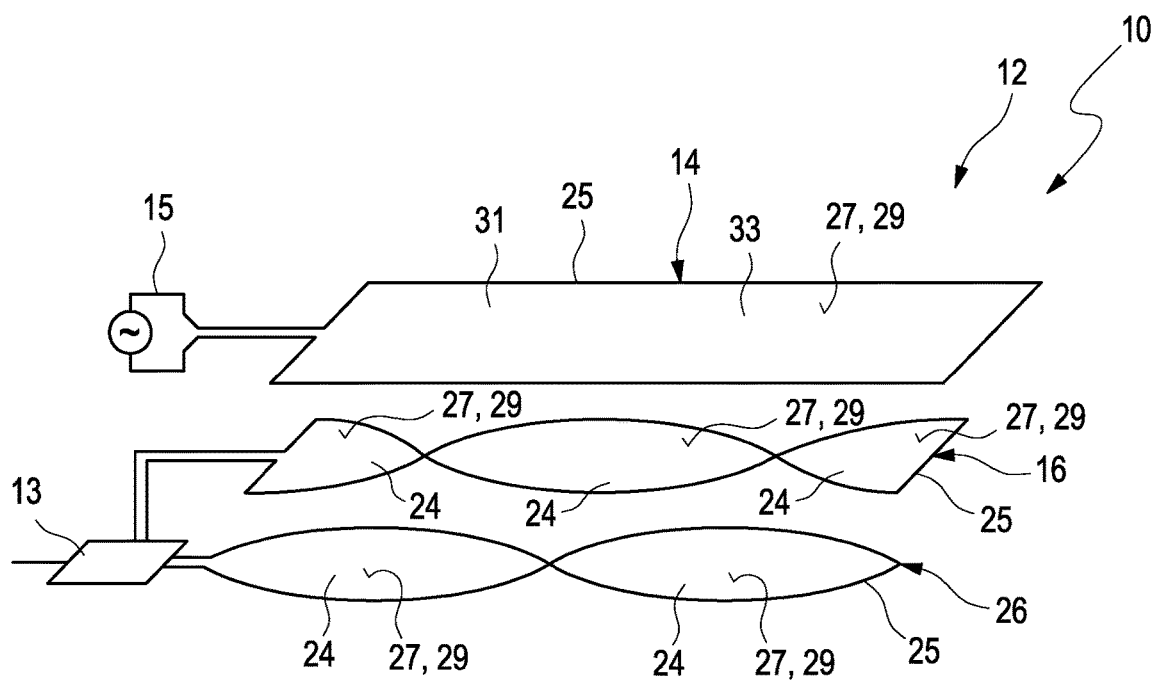
Fig. 3
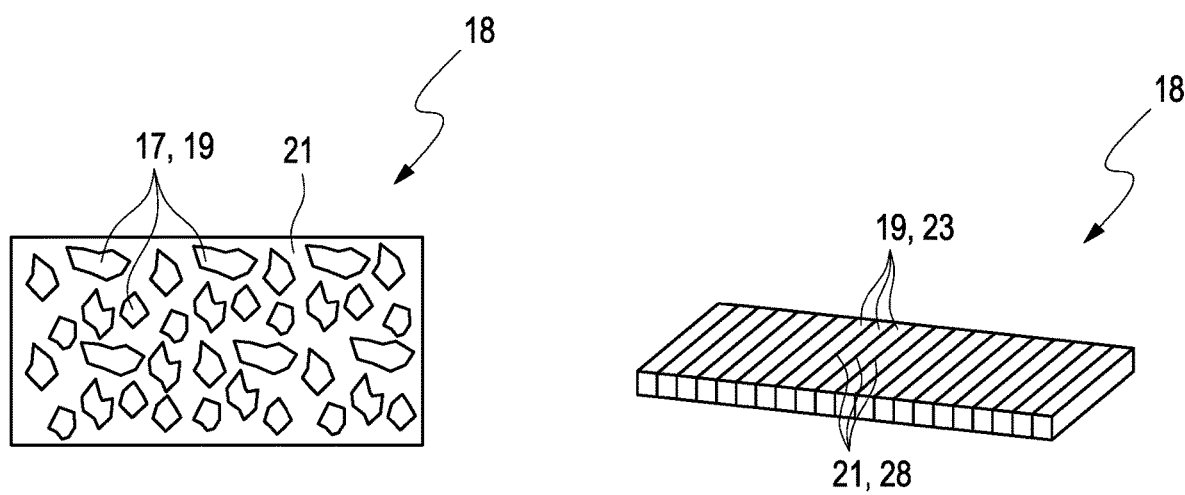
Fig. 4
Fig. 5

MAGNETIC POSITION SENSOR

CROSS-REFERENCE TO RELATED APPLICATIONS

This application claims priority to German Patent Application No. DE 10 2018 207 994.3, filed on May 22, 2018, the contents of which is hereby incorporated by reference in its entirety.

TECHNICAL FIELD

The invention relates to a magnetic position sensor with a coil arrangement comprising at least one transmitter coil and at least one receiver coil, with a magnetic coupling element and with a test element, the position of which in a measurement direction is intended to be determined.

BACKGROUND

In such magnetic position sensors, an AC voltage is usually applied to the transmitter coil such that the transmitter coil produces an alternating magnetic field. Further, the receiver coil is arranged in such a way that the magnetic flux produced by the transmitter coil at least partly passes through the receiver coil, and so AC voltages can be induced in the receiver coil. Further, a magnetic coupling element is provided, which amplifies the magnetic flux produced by the transmitter coil and/or at least partly guides said magnetic flux to the receiver coil. The test element is embodied in such a way that it produces a magnetic field, for example by a permanent magnet or by an electromagnet. This magnetic field is large enough to locally magnetically saturate the coupling element such that the amplification effect or the guiding effect of the coupling element is at least locally attenuated so that the voltages induced in the receiver coil change. The position of the test element can be deduced depending on the change in the induced voltages.

By way of example, such magnetic position sensors are known from DE 36 10 479 A1. This magnetic path sensor has two transmitter coils, which are wound on a rod-shaped magnetic coupling element at both ends and which induce an opposing magnetic field into the coupling element. A receiver coil is wound along the magnetic element between the two transmitter coils. By way of magnetic saturation, the test element produces a virtual air gap within the coupling element, and so the induced voltage in the receiver coil is influenced depending on the position of the test element. However, this magnetic path sensor requires a relatively large volume.

Further, US2007/0194781 A1 has disclosed magnetic position sensors that use flat coils such that a compact design can be obtained. However, eddy currents are induced into the coupling element, said eddy currents attenuating the alternating magnetic field produced, and so the transmission power must be increased.

SUMMARY

The invention is based on the object of providing an improved embodiment, or at least a different embodiment, of a magnetic position sensor which is distinguished by lower power requirements, in particular.

According to the invention, this object is achieved by the subject matter of the independent claim(s). Advantageous developments are the subject matter of the dependent claim(s).

The invention is based on the basic concept of embodying the coupling element in such a way that the induced eddy currents are attenuated. According to the invention, provision is made for the coupling element to have a high-resistance material that is magnetizable or for the coupling element to have a magnetizable material and a material with a specific electrical resistance, which is greater than 100-times, preferably greater than 1000-times, the specific electrical resistance of the magnetizable material. The high-resistance material interrupts the current paths of the eddy currents, and so the eddy currents overall are greatly reduced. As a result, the power loss caused by the eddy currents is reduced. This, in turn, renders it possible to reduce the distance between the coil carrier and the coupling element or allows the coupling element to be applied directly on the coil carrier, and so the required installation space can likewise be reduced.

In the description and the appended claims, a material is considered to be high resistance if the specific electrical resistance of the material is greater than $10^{10}$ $\Omega mm^2$ $m^{-1}$.

An expedient variant provides for the coupling element to have particles made of the magnetizable material that are embedded in the high-resistance material. As a result, the coupling element itself is high-resistance, and so no eddy currents, or only very weak eddy currents, can form in the coupling element. At the same time, the coupling element is magnetizable.

A further expedient variant provides for the coupling element to have particles made of the magnetizable material that are surrounded by a high-resistance oxide layer. Elements sintered from such particles are magnetizable but not electrically conductive, or only poorly electrically conductive, and so the coupling element can amplify the alternating magnetic field and, at the same time, only weak eddy currents are induced.

A particularly expedient solution provides for the coupling element to have particles made of a magnetizable and ceramic material. By way of example, the coupling element may have ferrite particles, which are ceramic and hence high resistance, or even electrically insulating.

A particularly expedient variant provides for the coupling element to have a segmented embodiment, with electrical separating planes being formed, said electrical separating planes lying obliquely or perpendicular to a coil area of the transmitter coil. Consequently, the paths of the eddy currents are interrupted in targeted fashion by the segmenting of the coupling element, and so only small areas are available for the eddy currents such that the formation of the eddy currents is inhibited.

A further particularly expedient solution provides for the separating planes to be formed by layers made of high-resistance material. By way of example, this can be obtained by way of a layered structure, in which layers of the magnetizable material alternate with layers made of high-resistance material. This likewise reduces the formation of eddy currents. By way of example, such layers made of high-resistance material can be adhesive layers.

An expedient option provides for the transmitter coil and the receiver coil to be flat and for a cross section of a coil area of the transmitter coil to have an elongate extent in the measurement direction. As a result, the two coils, which each have a flat embodiment, can be arranged on one another such that only a small installation height is necessary transversely to the measurement direction.

It is understood that the transmitter coil and the at least one receiver coil are magnetically coupled to one another. As a result, an alternating magnetic field can be produced with the aid of the transmitter coil, said alternating magnetic field being able to induce voltages in the receiver coil. Consequently, the position of the test element can be deduced by observing induced voltages in the receiver coil.

In the description and the appended claims, a flat coil is understood to be a coil whose extent in a direction perpendicular to the coil area surrounded by the turns is less than an extent of the coils in the coil area, in particular less than 10%, preferably less than 5%. Particularly preferably, flat coils have only one spiral winding.

In the description and the appended claims, the turns of a coil are understood to mean, in particular, wound conductors or else conductor tracks on a printed circuit board, which surround an area.

In the description and the appended claims, a cross section with an elongate extent in a certain direction is understood to mean a cross section whose extent in this direction is greater than two times, preferably greater than three times and particularly preferably greater than four times the extent in a direction perpendicular thereto.

An expedient option provides for the at least one transmitter coil and the at least one receiver coil to be flat coils. Such flat coils have one or two conductors, which are wound in a plane in spiral fashion. Here, the coil conductor can be wound on a coil body, or can be formed as a printed circuit on a printed circuit board.

In the description and the appended claims, a coil area is understood to mean the area surrounded by the turns of the coil.

A further expedient option provides for the at least one transmitter coil and the at least one receiver coil to have at least two partial coils, the turns of which are opposite to one another and arranged offset from one another in the measurement direction. Spatial resolution can be obtained by the use of partial coils, either in the case of the transmitter coil or, preferably, in the case of the receiver coil. If the coupling element is locally magnetically saturated by the test element, there is a change in the magnetic coupling between the transmitter coil and the receiver coil. This causes the partial coils of the receiver coil to be penetrated by magnetic flux to a different extent, and so the induced voltages change, too. Consequently, a spatial resolution can be achieved by the subdivision into partial coils. Here, it is virtually irrelevant whether the transmitter coil or the receiver collar is subdivided. As a result of the offset of the partial coils in the measurement direction, the location of the test element in the measurement direction can be deduced by way of the measured induced voltages.

In the description and the appended claims, the phrase "arranged offset" comprises both a partial overlap and lying completely next to one another, with or without distance therebetween.

An advantageous solution provides for coil areas of the partial coils and the respective turn numbers to be embodied in such a way that the voltages induced in the receiver coil by the alternating magnetic field produced by the transmitter coil cancel one another out if no external influences are present. As a result, it is sufficient for the difference voltage between the two partial coils of the receiver coil to be observed in order to deduce the position of the test element. What is particularly advantageous in this case is that, if the two partial coils of the receiver coil are connected in series, a voltage is present only if the test element locally magnetically saturates the coupling element. As a result, the signal-to-noise ratio is particularly high. The signal-to-noise ratio is particularly high in the case of the split transmitter coil, too. Only the phase angle of the voltage measured at the receiver coil must be additionally taken into account.

A further advantageous solution provides for the partial coils of the receiver coil and/or of the transmitter coil each to have an effective coil area and for the respective effective coil areas of the partial coils of the receiver coil and/or of the transmitter coil to be of the same size. Provided the partial coils have a similar arrangement relative to the remaining coils, this causes the induced voltages just to cancel one another out without interference by the test element.

In the description and the appended claims, an effective coil area is understood to mean the coil area multiplied by the turn number.

An expedient variant provides for the coil area of the receiver coil to lie completely within or outside of the coil area of the transmitter coil. As a result, particularly effective magnetic coupling between the transmitter coil and the receiver coil can be achieved.

A further expedient solution provides for the coil arrangement to have at least one second receiver coil. Here, this second receiver coil preferably covers a different spatial region; in particular, the coil area of the second receiver coil differs from the coil area of the first receiver coil. This facilitates a more accurate and better spatial resolution since, as a result thereof, the two receiver coils have different spatial dependences in respect of the location of the test element.

An advantageous option provides for the at least one transmitter coil and the at least one receiver coil to adjoin one another and/or lie in the same plane. Firstly, this can achieve particularly good magnetic coupling. Secondly, this can reduce the installation space required in the stack direction.

A particularly advantageous option provides for the at least one transmitter coil and the at least one receiver coil to be arranged on the same coil carrier. As a result, a particularly compact construction of the coil arrangement can be achieved.

A further particularly advantageous option provides for the coil carrier to be a printed circuit board, on which coil carrier the transmitter coil and the receiver coil are formed by conductor tracks. Coils formed in this way can be produced in particularly cost-effective fashion. Moreover, particularly good magnetic coupling between the receiver coil and the transmitter coil can be obtained on account of the spatial vicinity of the transmitter coil to the receiver coil.

An expedient solution provides for the coil area of the transmitter coil to be substantially rectangular. Such a rectangular transmitter coil can be formed in very simple fashion on a printed circuit board and produces an unchanging magnetic field over the measurement path in the measurement direction. Here, provision is preferably made for the coil areas of the partial coils of the receiver coil to have sinusoidal or cosine-shaped outer contours. As a result, it is possible to evaluate the phase angle of the induced voltage in the receiver coil in order to deduce the position of the virtual air gap and hence the position of the test element.

An advantageous variant provides for the coupling element to be arranged on the coil arrangement such that at least an upper side of the coil arrangement is covered by the coupling element. As a result, the coupling element brings about an amplification of the magnetic field produced by the transmitter coil such that the coupling between the transmitter coil and the receiver coil is amplified. Secondly, the coupling element causes the magnetic field not to extend into the region in which the test element is situated. Or, expressed differently, this region is at least partly shielded by the coupling element. As a result of this, no eddy currents, which could falsify the measurement, are induced in metallic objects situated in this region.

The measurement principle of exploiting the magnetic saturation in the coupling element to produce a type of virtual air gap allows the produced alternating magnetic field to be shielded to the outside, and so electrically conductive objects do not influence the measurement, or at least only influence it a little.

Here, the upper side of the coil arrangement is the side of the coil arrangement on which the test element is arranged in movable fashion.

An advantageous option provides for the coupling element to be applied to the coil carrier in integrally bonded fashion, for example by adhesive bonding, lacquering or printing. As a result, the distance between the coupling element and the coils is particularly small such that the coupling effect of the coupling element is particularly good.

A further advantageous variant provides for the coupling element to at least partly enclose the coil arrangement. This achieves even better shielding of the produced magnetic field to the outside. At the same time, this also improves the magnetic coupling between the transmitter coil and the receiver coil.

A further particularly advantageous variant provides for the coupling element to have a U-shaped or C-shaped cross section. As a result, the alternating magnetic field produced by the transmitter coil can be guided in particularly expedient fashion such that there is improved coupling between the transmitter coil and the receiver coil.

Particularly preferably, provision is made for the coupling element to completely surround the coil arrangement. As a result, virtually no magnetic field penetrates to the outside.

An expedient option provides for the coupling element to be magnetizable, in particular to be ferromagnetic or ferrimagnetic. By way of example, such coupling elements could have mu-metal or ferrites as material. These materials are distinguished by a high magnetic permeability and, at the same time, by a rather lower magnetic saturation.

Further important features and advantages of the invention emerge from the dependent claims, from the drawings and from the associated description of the figures on the basis of the drawings.

It is understood that the features specified above and the features yet to be explained below can be used not only in the respectively specified combination, but also in any other combination or on their own, without departing from the scope of the present invention.

Preferred exemplary embodiments of the invention are illustrated in the drawings and explained in more detail in the following description, with the same reference signs relating to the same or similar or functionally equivalent components.

BRIEF DESCRIPTION OF THE DRAWINGS

In each case schematically in the drawings:

FIG. 3 shows a perspective view of a coil arrangement of a magnetic position sensor according to a second embodiment, FIG. 4 shows a basic elucidating illustration of the composition of a coupling element, and FIG. 5 shows a basic elucidating illustration of the segmented coupling element.

DETAILED DESCRIPTION

Figure 1:
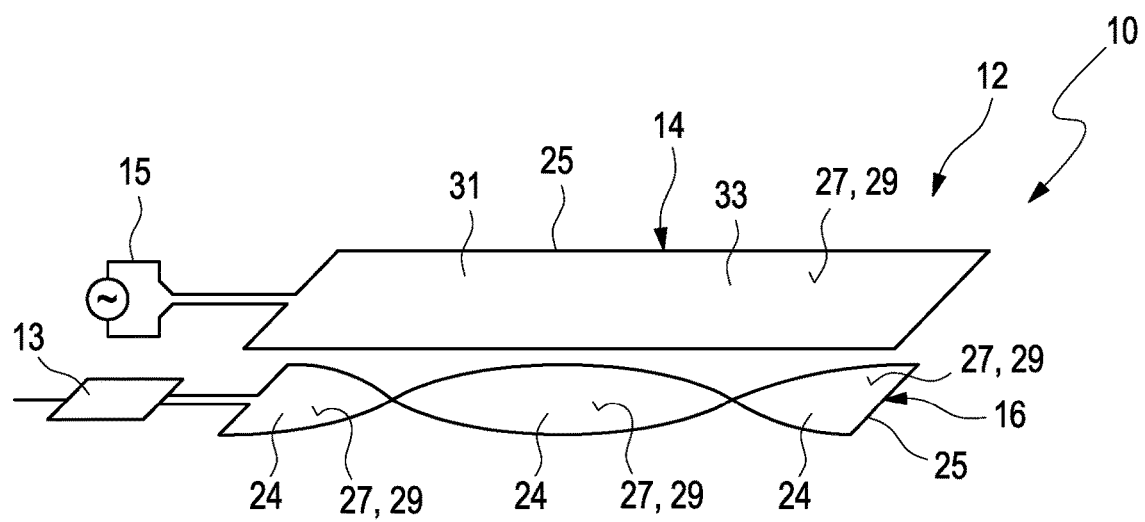
FIG. 1 shows a schematic diagram of a coil arrangement of a magnetic position sensor.

An embodiment of a magnetic position sensor 10, illustrated in FIGS. 1 to 5, comprises a coil arrangement 12 with a transmitter coil 14 and a receiver coil 16. Further, the coil arrangement 12 comprises a coupling element 18, which amplifies the magnetic field produced by the transmitter coil 14 and/or guides said magnetic field to the receiver coil 16. Further, provision is made of a test element 20, which is arranged in movable fashion along a measurement path 22 and the position of which along the measurement path 22 can be determined by the position sensor 10. Moreover, provision is made of an evaluation device 13, which measures and evaluates the voltages induced in the receiver coil 16.

An AC voltage source 15 is connected to the transmitter coil 14 such that an AC voltage is applied to the transmitter coil 14 and the transmitter coil produces an alternating magnetic field. This alternating magnetic field in turn induces voltages in the receiver coil 16.

The receiver coil 16 comprises a plurality of partial coils, for example three partial coils, which are electrically connected in series and arranged in such a way that the voltages induced by the alternating electric field cancel one another out overall in the individual partial coils.

The transmitter coil 14 and the receiver coil 16 have a flat embodiment; i.e., the turns 25 of the coils are wound not in helical but in spiral fashion. In particular, the turns 25 lie in a plane. Preferably, the turns 25 are formed by conductor tracks on a printed circuit board. Here, the transmitter coil 14 and the receiver coil 16 may be formed on the same printed circuit board, for example on a multi-layer printed circuit board. As a result, the printed circuit board forms a common coil carrier for the transmitter coil 14 and the receiver coil 16.

The turns 25 of the transmitter coil 14 therefore surround a coil area 27. The sum of the turns 25 weighted by the respective enclosed area of the turns 25 yields an effective coil area 29. Accordingly, the partial coils 24 of the receiver coil 16 also have a coil area 27 and an effective coil area 29.

Figure 2:
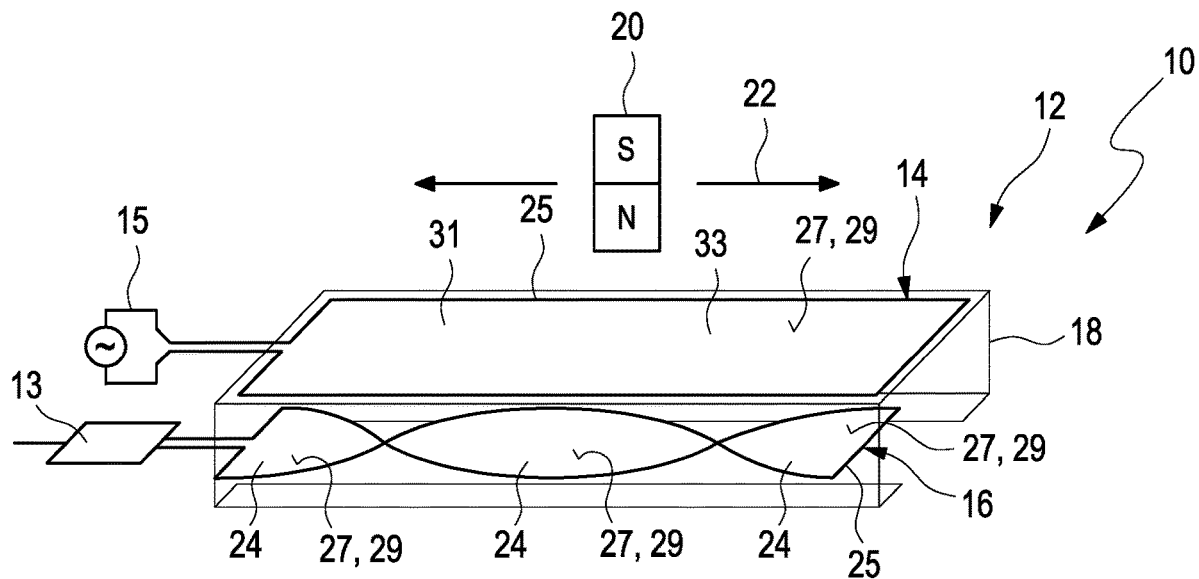
FIG. 2 shows a perspective view of a magnetic position sensor 10.

In the variant of the embodiment of the magnetic position sensor 10 illustrated in FIGS. 1 and 2, the transmitter coil 14 has a coil area 27 which has an elongate cross section 31. Here, the cross section 31 of the coil area 27 of the transmitter coil 14 has an elongate extent in the direction of the measurement path 22. The extent of the coil arrangement in the direction of the measurement path 22, as required for the measurement, is therefore obtained by the extent of the coil area 27. In contrast to an elongated cylindrical coil, the magnetic position sensor can have a smaller embodiment as a result thereof.

The coupling element 18, which has soft-magnetic material, is provided on the coil arrangement 12. As a result, the coupling element 18 amplifies the magnetic field produced by the transmitter coil 14. Moreover, the coupling element 18 can also guide the magnetic field lines. Here, the coupling element 18 is shaped in such a way that the magnetic field produced by the transmitter coil 14 is also guided to the receiver coil 16. In particular, the coupling element 18 brings about an amplified magnetic coupling between the transmitter coil 14 and the receiver coil 16.

Here, the coupling element 18 is preferably planar, i.e., formed from a flat material, and placed on or around the coil arrangement 12. Here, the coupling element 18 can either only cover an upper side 33 of the coil arrangement 12 or, as shown in FIG. 2, for example, surround the coil arrangement in approximately U-shaped fashion. It is also possible for the coupling element to surround the coil arrangement in C-shaped fashion or completely.

Preferably, the coupling element 18 has a material with a very low electrical conductivity, preferably an electrical insulator. By way of example, the coupling element 18 may have ferrites, which have a high magnetic permeability and, at the same time, a very low electrical conductivity. Such ferrites also have a relatively low magnetic saturation field strength, which is advantageous for the functionality of the magnetic position sensor 10, as will still be explained below. The saturation of the coupling element 18 can be achieved more easily in combination with the flat material.

As an alternative or in addition thereto, the coupling element 18 may have magnetizable particles 17 made of a magnetizable material 19, which are embedded in a high-resistance material 21, as illustrated in exemplary fashion in FIG. 4. By way of example, the high-resistance material 21 can be plastic, wherein the magnetizable particles 17 can be made of metal or ceramic. Therefore, the coupling element 18 can be adhesively bonded or printed on the coil carrier or the printed circuit board in the case of an appropriate selection of the plastic.

Moreover, sintered materials are also possible; here, metal particles are surrounded by an electrically insulating oxide layer.

Further, the coupling element 18 can have a segmented embodiment. By way of example, the coupling element 18 can have a plurality of layers 23 made of magnetizable material 19 and layers 28 made of high-resistance material 21 arranged in alternating fashion, as illustrated in FIG. 5 in exemplary fashion. Here, the high-resistance material 21 preferably has an electrical resistance, which is 100-times, preferably 1000-times, the electrical resistance of the magnetizable material 19. As a result, separating planes 28, through which the eddy currents do not flow, are formed, and so the formation of the eddy currents is inhibited.

The test element 20 produces a magnetic field. Preferably, the test element 20 has a permanent magnetic material in order to produce the magnetic field. However, it would also be conceivable for the test element to contain an electromagnet.

The magnetic field produced by the test element 20 is strong enough to at least locally saturate the magnetic material of the coupling element 18. As a result, the coupling effect of the coupling element 18 is reduced. As it were, the test element 20 causes a virtual air gap in the coupling element 18. Since this virtual air gap does not extend over the entire coupling element 18 but is only formed locally in the vicinity of the test element 20, the location of the test element 20 can be deduced therefrom.

The structure of the receiver coil 16 is of importance in order to be able to deduce the location of the test element on the measurement path 22. The receiver coil 16 is subdivided into a plurality of partial coils 24, for example three partial coils, the induced voltage of which cancel one another out, as mentioned previously. However, as a result of the local disturbance of the coupling element 18 by the test element 20, the partial voltage induced in at least one of the partial coils is modified, and so the induced voltages in the partial coils 24 no longer cancel one another out. As a result, the position of the test element 20 can be deduced from the magnitude and the phase angle of the induced residual voltage.

In order to increase the measurement accuracy or in order to simplify the evaluation, provision can be made of a second receiver coil 26, which likewise has a plurality of partial coils 24, for example two partial coils. However, these partial coils 24 are subdivided differently in space to the partial coils 24 of the first receiver coil 16. An exemplary arrangement is illustrated in FIG. 3.

The second receiver coil 26, illustrated at the bottom in FIG. 3, allows a decision to be made as to whether the test element 20 is on the left or right half of the measurement path 22. On account of its form, the first receiver coil 16, which is illustrated over the second receiver coil 26, allows a decision to be made as to whether the test element 20 lies centrally or at the edge of the measurement path 22. As a result, a logic on its own can already ascertain the quadrant of the measurement path 22 in which the test element 20 is situated.

Preferably, the partial coils 24 of the first receiver coil 16 and the second receiver coil 26 have sinusoidal or cosine-shaped profiles. As a result, a sinusoidal or cosine-shaped dependence of the induced voltages in the receiver coils 16 and 26 also arises, depending on the position of the test element on the measurement path 22. As a result, the location of the test element 20 on the measurement path 22 can be deduced by ascertaining the phase angle of the resultant overall voltage in relation to the voltage applied to the transmitter coil 14.

The invention claimed is:

1. A magnetic position sensor, comprising:
   a coil arrangement including at least one transmitter coil and at least one receiver coil;
   a magnetic coupling element; and
   a test element movable along a measurement path, a position of which along the measurement path is determinable;
   wherein, when an AC voltage is applied to the at least one transmitter coil, the at least one transmitter coil provides an alternating magnetic field;
   the at least one receiver coil arranged such that a magnetic flux provided via the at least one transmitter coil at least partly passes through the at least one receiver coil;
   the magnetic coupling element configured to at least one of amplify the magnetic flux and at least partly guide the magnetic flux to the at least one receiver coil;
   the test element providing a magnetic field large enough to locally magnetically saturate the magnetic coupling element;
   wherein the at least one transmitter coil surrounds a coil area and is structured as a flat coil having an extent in a direction perpendicular to the coil area that is less than an extent of a portion of the transmitter coil disposed within the coil area; and
   wherein the magnetic coupling element includes at least one of:
   a high-resistance material that is magnetizable; and
   a magnetizable material and a material with a specific electrical resistance which is greater than 100-times a specific electrical resistance of the magnetizable material.

2. The magnetic position sensor according to claim 1, wherein the magnetic coupling element includes the high-resistance material, and wherein a plurality of particles of the magnetizable material are embedded in the high-resistance material.

3. The magnetic position sensor according to claim 1, wherein the magnetic coupling element includes a plurality of particles of the magnetizable material surrounded by an electrically insulating oxide layer.

4. The magnetic position sensor according to claim 1, wherein the magnetic coupling element includes a plurality of particles of the magnetizable material, and wherein the magnetizable material is a ceramic material.

5. The magnetic position sensor according to claim 1, wherein the magnetic coupling element is segmented and further includes a plurality of electrical separating planes lying one of obliquely and perpendicular to the coil area of the at least one transmitter coil.

6. The magnetic position sensor according to claim 5, wherein the plurality of electrical separating planes are structured as layers of the high-resistance material.

7. The magnetic position sensor according to claim 1, wherein the at least one receiver coil is structured as a flat coil, and wherein a cross section of the coil area of the at least one transmitter coil has an elongate extent in a direction of the measurement path.

8. The magnetic position sensor according to claim 1, wherein at least one of the at least one transmitter coil and the at least one receiver coil includes at least two partial coils respectively having a plurality of turns which are oriented opposite to one another and arranged offset from one another in a direction of the measurement path.

9. The magnetic position sensor according to claim 8, wherein the at least two partial coils have a respective coil area and a respective number of the plurality of turns such that voltages induced in the at least one receiver coil via the alternating magnetic field cancel one another out when no external influences are present.

10. The magnetic position sensor according to claim 1, wherein:
the at least one transmitter coil and the at least one receiver coil lie in a common plane that extends parallel to the measurement path; and
the at least one receiver coil defines a coil area that is disposed completely within the coil area of the at least one transmitter coil.

11. The magnetic position sensor according to claim 1, wherein:
the at least one transmitter coil and the at least one receiver coil are arranged on a coil carrier; and
the coil carrier is a printed circuit board on which the at least one transmitter coil and the at least one receiver coil are defined by conductor tracks.

12. The magnetic position sensor according to claim 1, wherein the magnetic coupling element is arranged on the coil arrangement such that at least an upper side of the coil arrangement is covered by the magnetic coupling element.

13. The magnetic position sensor according to claim 1, wherein the magnetic coupling element at least partly encloses the coil arrangement.

14. The magnetic position sensor according to claim 13, wherein the magnetic coupling element has one of a U-shaped cross section and a C-shaped cross section.

15. A magnetic position sensor, comprising:
a coil arrangement including at least one transmitter coil and at least one receiver coil, the at least one transmitter coil and the at least one receiver coil structured as flat coils;
a magnetic coupling element; and
a test element movable along a measurement path, a position of which along the measurement path is determinable;
wherein, when an AC voltage is applied to the at least one transmitter coil, the at least one transmitter coil provides an alternating magnetic field;
the at least one receiver coil arranged such that a magnetic flux provided via the at least one transmitter coil at least partly passes through the at least one receiver coil;
the magnetic coupling element configured to at least one of amplify the magnetic flux and at least partly guide the magnetic flux to the at least one receiver coil;
the test element providing a magnetic field large enough to locally magnetically saturate the magnetic coupling element;
wherein the magnetic coupling element includes a plurality of particles of a magnetizable material;
wherein the magnetizable material is a ceramic material;
wherein the magnetic coupling element further includes at least one of:
a high-resistance material that is magnetizable; and
a material with a specific electrical resistance which is greater than 100-times a specific electrical resistance of the magnetizable material;
wherein the at least one receiver coil includes at least two partial coils arranged offset from one another in a direction of the measurement path, the at least two partial coils respectively having a plurality of turns that are oriented opposite to one another and that define a coil area; and
wherein the coil area has at least one of a sinusoidal-shaped outer contour and a cosine-shaped outer contour.

16. A magnetic position sensor, comprising:
a coil arrangement including a transmitter coil and a plurality of receiver coils;
a magnetic coupling element; and
a test element movable along a measurement path, a position of which along the measurement path is determinable;
wherein, when an AC voltage is applied to the transmitter coil, the transmitter coil provides an alternating magnetic field;
the plurality of receiver coils arranged such that a magnetic flux provided via the transmitter coil at least partly passes through the plurality of receiver coils;
the magnetic coupling element configured to at least one of amplify the magnetic flux and at least partly guide the magnetic flux to the plurality of receiver coils;
the test element providing a magnetic field large enough to locally magnetically saturate the magnetic coupling element;
wherein the magnetic coupling element includes at least one of:
a high-resistance material that is magnetizable; and
a magnetizable material and a material with a specific electrical resistance which is greater than 100-times a specific electrical resistance of the magnetizable material;
wherein the plurality of receiver coils each include a plurality of partial coils respectively having a plurality of turns; and
wherein the plurality of partial coils of a first receiver coil of the plurality of receiver coils are subdivided differently from the plurality of partial coils of a second receiver coil of the plurality of receiver coils.

17. The magnetic position sensor according to claim 1, wherein:
- the at least one receiver coil includes at least two partial coils respectively having a plurality of turns that that define a coil area; and
- the coil area of each of the at least two partial coils has at least one of a sinusoidal-shaped outer contour and a cosine-shaped outer contour.

18. The magnetic position sensor according to claim 1, wherein:
- the at least one receiver coil includes a plurality of receiver coils, the plurality of receiver coils including a first receiver coil and a second receiver coil;
- the plurality of receiver coils each include a plurality of partial coils respectively having a plurality of turns; and
- the plurality of partial coils of the first receiver coil are subdivided differently from the plurality of partial coils of the second receiver coil.

19. The magnetic position sensor according to claim 1, wherein:
- the coil area of the at least one transmitter coil is substantially rectangular;
- the rectangular coil area forms an entirety of a space surrounded by the at least one transmitter coil; and
- the at least one transmitter coil is disposed completely outside of the rectangular coil area.

20. The magnetic position sensor according to claim 1, wherein:
- the at least one transmitter coil only includes a single winding; and
- the single winding defines an outer contour of the coil area of the at least one transmitter coil.

\* \* \* \* \*